United States Patent
Lee

(10) Patent No.: US 7,173,873 B2
(45) Date of Patent: Feb. 6, 2007

(54) DEVICE AND METHOD FOR BREAKING LEAKAGE CURRENT PATH

(75) Inventor: Cheng-Sheng Lee, Kaohsiung (TW)

(73) Assignee: Winbond Electronics Corp., Hsinchu (TW)

( * ) Notice: Subject to any disclaimer, the term of this patent is extended or adjusted under 35 U.S.C. 154(b) by 169 days.

(21) Appl. No.: 10/707,082

(22) Filed: Nov. 20, 2003

(65) Prior Publication Data

US 2005/0052933 A1 Mar. 10, 2005

(30) Foreign Application Priority Data

Sep. 9, 2003 (TW) .............................. 92124836 A

(51) Int. Cl.
*G11C 5/14* (2006.01)
*G11C 7/00* (2006.01)
*G11C 7/02* (2006.01)

(52) U.S. Cl. ..................... 365/227; 365/191; 365/193; 365/195; 365/196; 365/207; 365/229

(58) Field of Classification Search ................ 365/226, 365/227, 228, 229, 191, 193, 195, 196
See application file for complete search history.

(56) References Cited

U.S. PATENT DOCUMENTS

| | | | | |
|---|---|---|---|---|
| 4,346,458 A | * | 8/1982 | Berger et al. ................ 365/154 |
| 4,455,627 A | * | 6/1984 | Oritani ........................ 365/226 |
| 4,587,639 A | * | 5/1986 | Aoyama et al. ............. 365/200 |
| 5,426,603 A | * | 6/1995 | Nakamura et al. .......... 365/149 |
| 5,574,729 A | * | 11/1996 | Kinoshita et al. ............ 714/711 |
| 5,619,460 A | * | 4/1997 | Kirihata et al. .............. 365/201 |
| 5,673,231 A | * | 9/1997 | Furutani ...................... 365/203 |
| 5,787,046 A | * | 7/1998 | Furuyama et al. ..... 365/230.03 |
| 5,894,445 A | * | 4/1999 | Kobayashi ................... 365/208 |
| 6,065,143 A | * | 5/2000 | Yamasaki et al. ........... 714/720 |
| 6,259,636 B1 | * | 7/2001 | Fukuda et al. ............... 365/200 |
| 6,449,204 B1 | * | 9/2002 | Arimoto et al. ............. 365/222 |
| 6,707,707 B2 | * | 3/2004 | Marr ........................... 365/154 |
| 6,839,272 B2 | * | 1/2005 | Ooishi ......................... 365/171 |
| 6,885,579 B2 | * | 4/2005 | Sakimura et al. ........... 365/158 |
| 2001/0055233 A1 | * | 12/2001 | Nagai ....................... 365/225.7 |
| 2002/0118590 A1 | * | 8/2002 | Furutani et al. ........ 365/230.03 |
| 2003/0103368 A1 | * | 6/2003 | Arimoto et al. ............... 365/63 |

* cited by examiner

*Primary Examiner*—Amir Zarabian
*Assistant Examiner*—Ly Duy Pham
(74) *Attorney, Agent, or Firm*—Jianq Chyun IP Office

(57) ABSTRACT

A device and a method for breaking the leakage current path, wherein the leakage current is caused by a defect in a memory cell of a memory array, are provided. The device includes a column selection line, a row selection line, a switch device coupled to the column selection line, the row selection line, a power supply terminal and a memory cell. When a column turn-off signal is coupled to the column selection line and a row turn-off signal is coupled to the row selection line, the switch device is turned off and thus a power from the power supply terminal can not be coupled to the memory cell. When at least one of the column selection line and the row selection line does not receive the turn-off signal, the switch device is not turned off and the power can be coupled to the memory cell.

14 Claims, 4 Drawing Sheets

DEVICE AND METHOD FOR BREAKING LEAKAGE CURRENT PATH

CROSS REFERENCE TO RELATED APPLICATIONS

This application claims the priority benefit of Taiwan application serial no. 92124836, filed Sep. 9, 2003.

BACKGROUND OF INVENTION

1. Field of the Invention

The present invention relates to a circuit structure of a memory cell and a memory, more particularly to a device and a method for breaking leakage current path within a memory cell and a memory device.

2. Description of the Related Art

Traditionally, a semiconductor memory device includes a non-volatile memory and a volatile random access memory (RAM). The non-volatile memory retains the stored data even the power applied thereto is turned off, while the volatile memory, such as a static random access memory (SRAM) and dynamic a random access memory (DRAM), loses the stored data when the power applied thereto is turned off.

As to the volatile memory, the difference between SRAM and DRAM is that the storage unit of SRAM is transistors. Therefore, SRAM has a speed five times of that of DRAM. However, the cell size and cost of SRAM are higher than those of DRAM. Therefore, DRAM is a more popular memory because of its smaller cell size and low cost. Because DRAM uses capacitors for storing data, charges stored deplete gradually because of the leakage current therefrom. Therefore, a periodic refresh is required. Once the power applied thereto is turned off, the stored data will be lost. Even if a power is applied thereto, the stored data is gradually lost and a refresh step is required because of leakage current generated therefrom.

Basically, a memory cell of a DRAM is composed of a transistor and a capacitor. Please referring to FIG. 1, FIG. 1 shows a schematic drawing of a unit cell structure of a DRAM, wherein the logic state of a DRAM depends on whether charges are being stored within the capacitor or not. When the density level of a DRAM is high and the cell size of a DRAM becomes small, it is hard to avoid circuit short resulting from process defects. Please referring FIG. 1, a traditional DRAM array, for example, includes memory cells 102 and 104, as well as a sensing amplifier 106, wherein a defect generated during manufacturing results in a short of the bit-line and word-line of the memory cell 102 at A. Therefore, a leakage current F from a power supply terminal VBLEQ flows through the bit-line to the ground terminal of the capacitor within the memory cell 102. When the memory is in a stand-by state, the leakage current consumes a substantial amount of the power. The longer the stand-by state, the more the power is consumed.

Generally, in order to maintain a high signal to noise (S/N) ratio, it is impossible to reduce the capacitance for reducing the leakage current. The leakage current usually is about 300 µA at each short spot. A prior art method for improvement is disclosed. FIG. 2 is a circuit structure of an improved DRAM cell. As shown in FIG. 2, a current-limit device, such as a depletion mode NMOS transistor 212 having a low threshold voltage, is connected to the bit-line precharger of the memory cell 102 for reducing leakage current. By the current-limit device, the leakage current can be reduced to 15 µA at each short spot.

However, the disadvantage of the current-limit device described above is that the leakage current still exists and a longer time for precharge is required even though defective memory cells in the array of memory cells are replaced by redundancy cells. Moreover, the total leakage current is proportional to the number of the defective memory cells. As to the electronic devices, such as portable devices, for example, notebooks, the leakage current will substantially reduce the service life of batteries, slow the speed of memory devices, and increase the temperature of computers. Therefore, a device and a method for breaking the leakage current path is desirable.

SUMMARY OF INVENTION

The object of the present invention is to provide a device, a method, memory cell and a memory, wherein the leakage current path is opened, and the problems of power consumption and rise of temperature resulting from the leakage current are resolved.

In order to achieve one object of the present invention, the present invention discloses a device for breaking the leakage current path for a memory array of a memory device, which comprises a column selection line adapted to select a column of a memory cell within a memory array; a row selection line adapted to select a row of the memory cell within the memory array; and a switch device coupled to the memory cell, a power supply terminal, the column selection line and the row selection line, wherein when the column selection line receives a column turn-off signal and the row selection line receives a row turn-off signal, the switch device is turned off so that a power provided from the power supply terminal is not coupled to the memory cell, and when at least one of the column selection line and the row selection line does not receive the column turn-off signal or the row turn-off signal, the power provided from the power supply terminal is coupled to the memory cell.

As the device for breaking the leakage current path described above, the column turn-off signal and the row turn-off signal are controlled by a stand-by signal.

In order to achieve one object of the present invention, the present invention discloses a method for breaking the leakage current path, which comprises first selecting a column in response to a memory cell within a memory array; then selecting a row in response to the memory cell within the memory array; and coupling a column turn-off signal to the column and a line turn-off signal to the row so that a power provided from a power supply terminal is not coupled to the memory cell, wherein when at least one of the column selection line and the row selection line does not receive at least one of the column turn-off signal and the row turn-off signal, the power provided from the power supply terminal is coupled to the memory cell.

As the method for breaking the leakage current path described above, the column turn-off signal and the row turn-off signal are controlled by a stand-by signal.

In order to achieve one object of the present invention, the present invention discloses a memory cell, which comprises a column selection line adapted to select a column of a memory cell within a memory array; a row selection line adapted to select a row of the memory cell within the memory array; and a device for breaking the leakage current path comprising a switch device coupled to the memory cell, a power supply terminal, the column selection line and the row selection line, wherein when the column selection line receives a column turn-off signal and the row selection line receives a row turn-off signal, the switch device is turned off so that a power provided from the power supply terminal is not coupled to the memory cell, and when at least one of the column selection line and the row selection line does not receive at least of the column turn-off signal and the row turn-off signal, the power provided from the power supply terminal is coupled to the memory cell.

As the memory device described above, the column turn-off signal and the row turn-off signal are controlled by a stand-by signal. More preferably, the memory device comprises a DRAM array.

In order to make the aforementioned and other objects, features and advantages of the present invention understandable, a preferred embodiment accompanied with figures is described in detail hereinafter.

DETAILED DESCRIPTION

Exemplary embodiments of the present invention are described below. These embodiments are used to describe the present invention, not to limit the scope thereof. The present invention can be applied, but not limited to, these embodiments.

Figure 1:
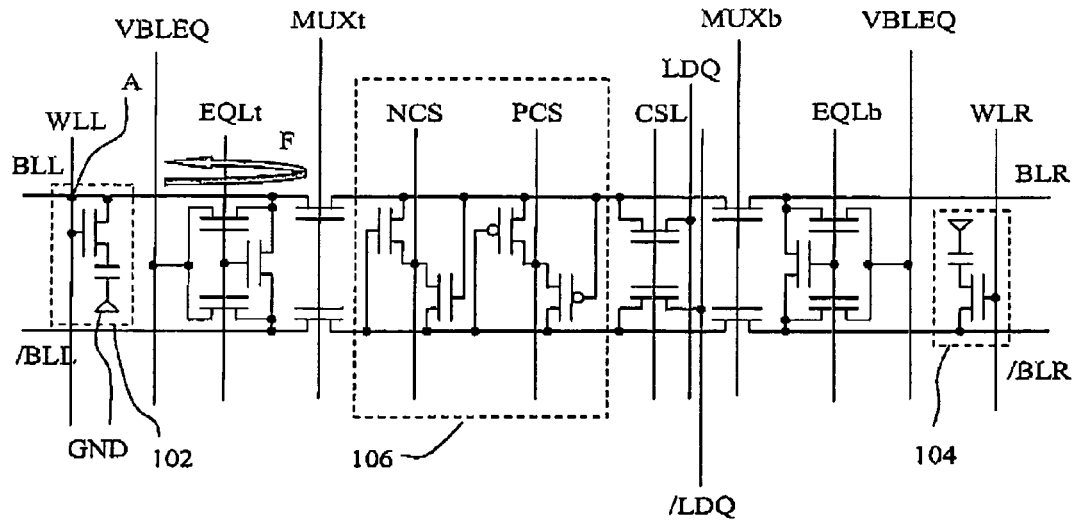
FIG. 1 is a schematic circuit drawing illustrating a circuit structure of a prior art DRAM cell.
Figure 2:
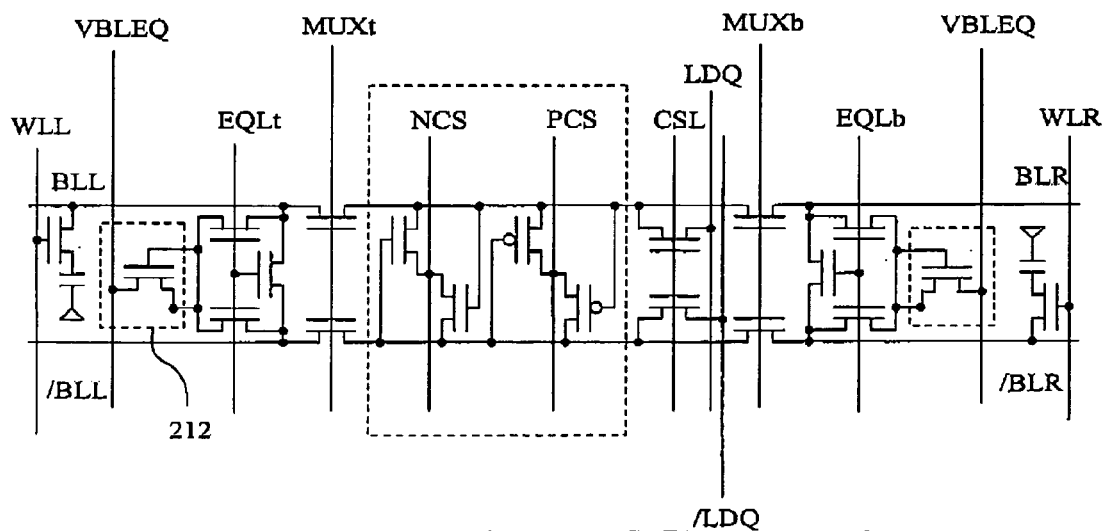
FIG. 2 is a circuit drawing illustrating a circuit structure of an improved DRAM cell of a prior art.
Figure 3:
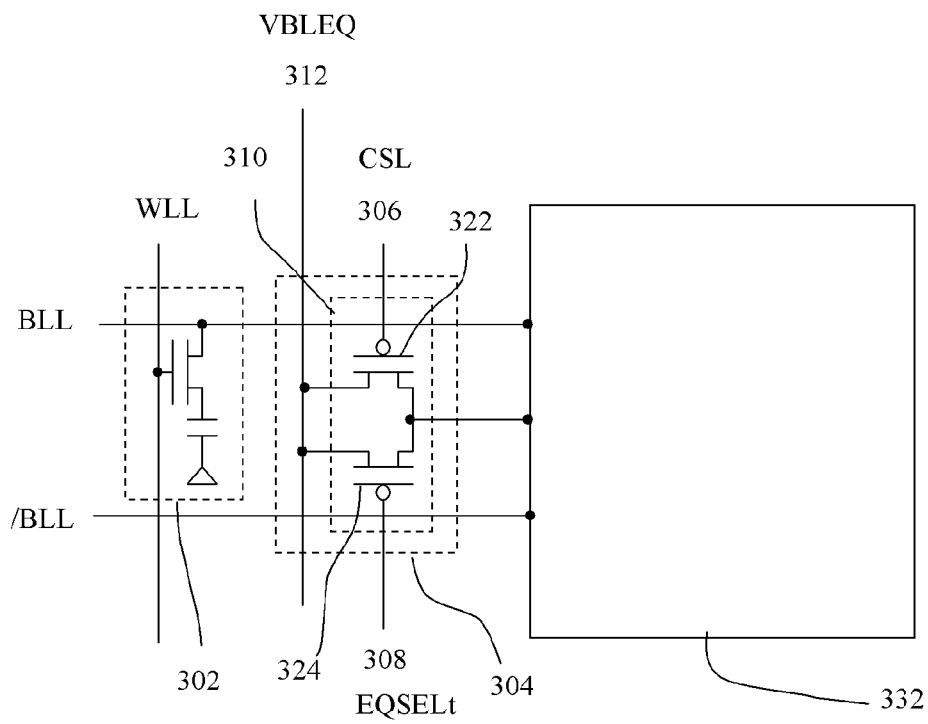
FIG. 3 is a schematic circuit drawing illustrating an exemplary circuit structure of a DRAM cell in accordance with the present invention.
Figure 4:
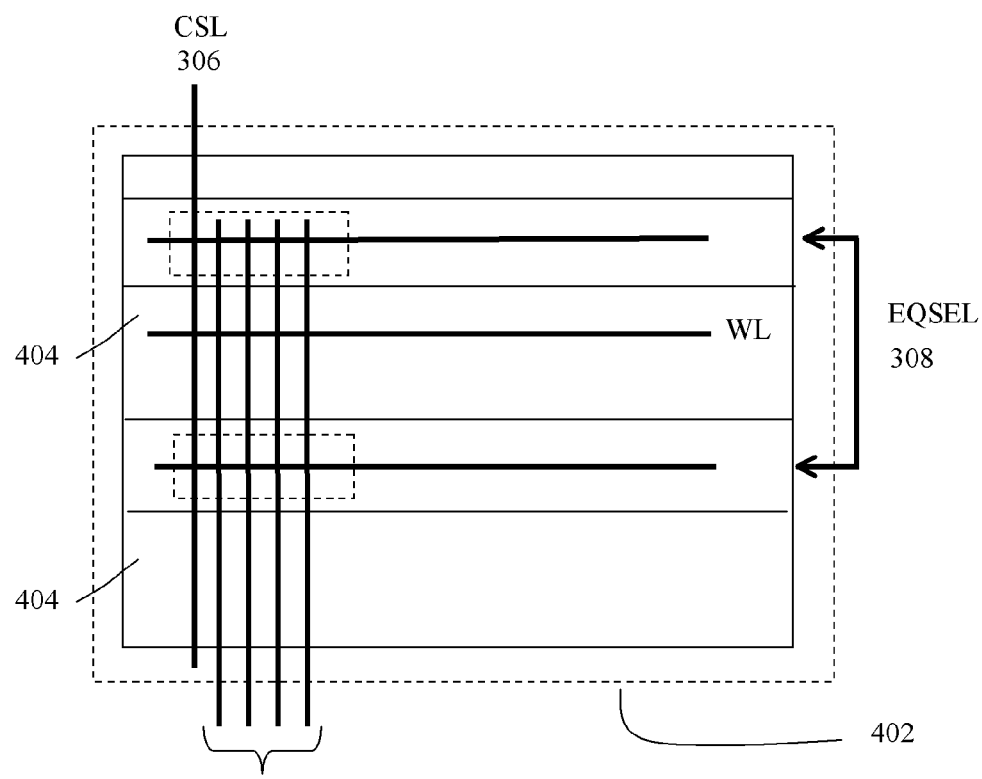
FIG. 4 is a schematic circuit drawing showing an exemplary circuit structure of a DRAM array in accordance with the present invention.

FIG. 3 is a schematic circuit drawing illustrating an exemplary circuit structure of a memory cell within a DRAM in accordance with the present invention. FIG. 4 is a schematic circuit drawing showing an exemplary circuit structure of a DRAM array in accordance with the present invention. Please referring to FIGS. 3 and 4, in a preferred embodiment of the present invention, a memory array comprises a memory cell 302, a sensing amplifier and a periphery circuit 332, and a device for breaking the leakage current path 304. The device for breaking the leakage current path 304 comprises a column selection line 306, a row selection line 308 and a switch device 310. The column selection line 306 is adapted to select a column within a memory array 402, which can be a column select line (CSL) or a global column select line within the memory array 402. The row selection line 308 is adapted to select a row of the memory array 402, which can be an equalized select line (EQSEL) for selecting a specific row of the memory array 402 and transferring a fault-free repair signal of a local memory block within the memory array 402. The switch device 310 is coupled to the memory cell 302, a power supply terminal 312, the column selection line 306 and the row selection line 308, wherein the power supply terminal 312 is coupled to a half bit-line high voltage (VBLEQ) of a memory array. The switch device 310 controls whether a power from the power supply terminal 312 is coupled to the array cell 302 by coupling a column turn-off signal to the column selection line 306 and a row turn-off signal to the row selection line 308. When the column selection line 306 receives the column turn-off signal and the row selection line 308 receives the row turn-off signal, the switch device 310 is turned off so that a power provided from the power supply terminal 312 is not coupled to the memory cell 302. When at least one of the column selection line 306 and the row selection line 308 does not receive the column turn-off signal or the row turn-off signal, the power provided from the power supply terminal 312 is coupled to the memory cell 302.

In the preferred embodiment of the present invention shown in FIG. 3, the switch device 310 is comprised of two PMOS transistors 322 and 324 or two PMOSFET transistors. The gate terminal of the PMOS transistor 322 is coupled to the column selection 306, and the source and drain terminals are coupled to the power supply terminal 312 and memory cell 302, respectively. When the column selection line 306 receives a column turn-off signal, the PMOS transistor 322 is turned off so that the power from the power supply terminal 312 is not coupled to the array cell 302. Similarly, the gate terminal of the PMOS transistor 324 is coupled to the row selection 308, and the source and drain terminals are coupled to the power supply terminal 312 and memory cell 302, respectively. When the row selection line 308 receives a row turn-off signal, the PMOS transistor 324 is turned off so that the power from the power supply terminal 312 is not coupled to the array cell 302. Therefore, only when the column selection line 306 receives the column turn-off signal and the row selection line 308 receives the row turn-off signal, the switch device 310 is turned off. When one of the column selection line 306 and the row selection line 308 does not receive the column turn-off signal or the row turn-off signal, the switch device 310 is not turned off.

Accordingly, when one memory cell of the memory array is a defective memory cell, leakage current is reduced by selecting the column selection line and row selection line in response to the memory cell so that the power of the power supply terminal is not coupled to the memory cell. For example, when the memory array is in a stand-by state, the power coupled to all defective memory cells is turned off so as to break the path of the leakage current generated from the defective memory cells. Therefore, the power consumption is substantially reduced.

Figure 5:
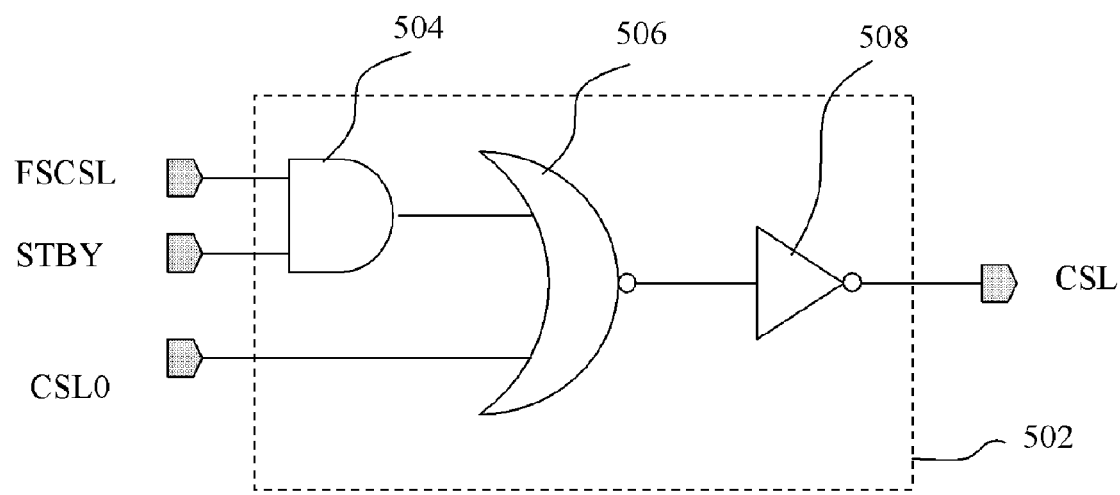
FIG. 5 is a schematic circuit drawing illustrating an exemplary circuit structure for generating a column selection signal in accordance with the present invention.
Figure 6:
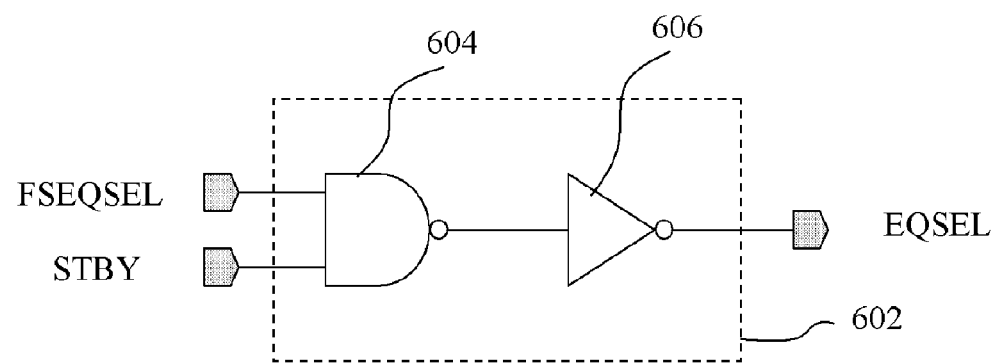
FIG. 6 is a schematic circuit drawing illustrating an exemplary circuit structure for generating a row selection signal in accordance with the present invention.

Following is a description related to how to generate the column turn-off signal and row turn-off signal in a preferred embodiment of the present invention. FIGS. 5 and 6 are schematic circuit drawings, each illustrating an exemplary circuit structure for generating a column selection signal and row selection signal, respectively, in accordance with the present invention.

Please referring FIG. 5, a circuit block 502, for example, is disposed between an original selection signal CSL0 and the column selection line 306 for controlling the original selection signal CSL0 and generating a final column selection signal (CSL) from a stand-by signal (STBY) and a fuse signal of column selection line (FSCSL), wherein the CSL is coupled to the column selection line 306. In FIG. 6, a circuit block 602, for example, generates a final row selection signal EQSEL from a stand-by signal and a fuse signal of EQSEL (FSEQSEL), wherein the final row selection signal EQSEL is coupled to the row selection line 308. The circuit blocks 502 and 602 are exemplary embodiment but which are not to be construed as limiting the scope of the present invention.

For a normal good die, FSCSL and FSEQSEL are both in a low state no matter whether it is in an active or a stand-by state. Therefore, no matter whether STBY is in a high state which means that the memory is in an active state, or a low state which means that the memory is in a stand-by state, the output therefrom is a low state because FSCSL is coupled to an AND gate 504. The low state is then coupled to a NOR gate 506. For a normal memory block, the output of the NOR gate 506 is in a high state because the CSL0 is in a low state no matter whether the CSL0 is in an active or a stand-by state. Finally, the CSL is in a low state after the output signal is processed by an inverter 508. In addition, from the circuit block 602, the output of the NAND gate is in a high state because the FSEQSEL is coupled to a NAND gate no matter whether the STBY is in a high or low state. The EQSEL is in a low state after the output signal is processed by an inverter 606.

Figure 7:
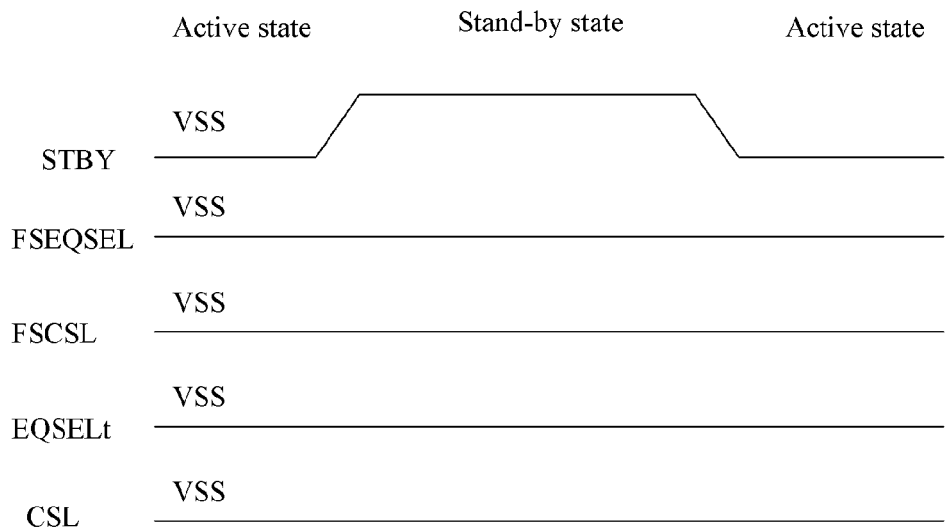
FIG. 7 is a circuit waveform illustrating a signal waveform of a normal memory block of an exemplary embodiment of the present invention.

In the embodiment described above, the FSCSL and FSEQSEL of a normal good die both are in a low state no matter whether it is in an active or stand-by state. Therefore, the CSL coupled to the column selection line 306 and the EQSEL coupled to the row selection line 308 are both in a low state, no matter whether the memory is in an active state which means the STBY is in a low state, or the memory is in a stand-by state which means the STBY is in a high state. As shown in FIG. 7, the STBY of the memory in an active state is in a low state VSS; the STBY of the memory in a stand-by state is in a high state VDD. Because the inputs coupled to the column selection line 306 and the row selection line 308 are in a low state VSS, two transistors within the switch device 310 are turned on which means that the memory cell 302 is selected and turned on. The power from the power supply terminal 312, therefore, is coupled the memory cell 302, and the bit-line (BLL) voltage of the memory cell 302 is, for example, VBLEQ, no matter whether the memory is in an active or a stand-by state.

In contrary, in the embodiment described above, for a defective memory block the FSCSL and FSEQSEL of the defective memory block are in a high state after the memory is powered on, no matter whether it is in an active or stand-by state. Therefore, from the circuit block 502 the output of the AND gate 504 has the same state as the STBY because the FSCSL is coupled to the AND gate 504. When the memory is in a stand-by state, i.e. a high state, the output of the AND gate 504 is also in a high state. After the output is processed by the NOR gate 506, it is in a low state; the CSL is in a high state when it processed by the inverter 508. In addition, from the circuit block 602 the output of the NAND gate 604 has an opposite state of the STBY because FSEQSEL is in a high state no matter whether it is in an active or stand-by state. The output signal is then processed by the inverter 606, and the EQSEL has a same state as the STBY.

Figure 8:
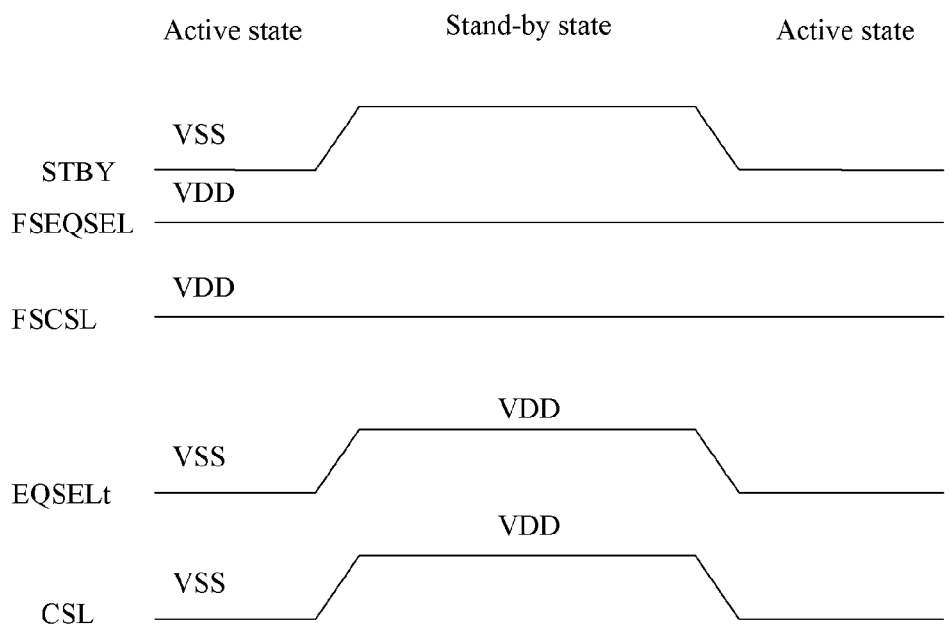
FIG. 8 is a circuit waveform illustrating a signal waveform of a defective memory block of an exemplary embodiment of the present invention.

In the embodiment described above, the FSCSL and FSEQSEL of a defective memory block are in a high state, no matter whether it is in an active or stand-by state. Therefore, the CSL of the column selection line 306 and the EQSEL of the row selection line 308 have the same state as the STBY. As shown in FIG. 8, the STBY is in a low state when the memory is in an active state VSS; the STBY is in a high state when the memory is in a stand-by state VDD. In a stand-by state the transistors of the switch device 310 are turned off because the signals coupled to the column selection line 306 and the row selection line 308 are in a high state VDD. Therefore, the power from the power supply terminal 312 is not coupled to the memory cell 302. Moreover, the high state VDD signals coupled to the column selection line 306 and the row selection line 308 are the column turn-off and row turn-off signals of the present invention.

In the embodiment described above, for a specific memory cell of a memory array, only when the column selection line and the row selection line in response thereto are selected is the power from the power supply terminal not coupled to the memory cell. When one of the column selection line and the row selection line is not selected, the power from the power supply terminal is still coupled to the memory cell.

Additionally, in another preferred embodiment of the present invention, a method for breaking the leakage current path is disclosed, which comprises selecting a column 306 in response to a memory cell 302 of a memory array 402; selecting a row 308 in response to the memory cell 302 of the memory array 402; not coupling a power supply terminal 312 to the memory cell 302 when the column 306 receives a column turn-off signal and the row 308 receives a row turn-off signal, wherein when one of the column 306 and the row 308 does not receive the column turn-off signal or the row turn-off signal, the power from the power supply terminal 312 is coupled to the memory cell 302.

It is preferred that the column turn-off signal and row turn-off signal are controlled by a stand-by signal in the method for breaking the leakage current path.

Moreover, in another preferred embodiment of the present invention, a memory device is disclosed. The memory device comprises a column selection line 306 adapted to select a column 306 of a memory cell 302 within a memory array 402; a row selection line 308 adapted to select a row 308 of the memory cell 302 within the memory array 402; and a leakage current cutter 304, which comprises a switch device 310 coupled to the memory cell 302, a power supply terminal 312, the column selection line 306 and the row selection line 308, wherein when the column selection line 306 receives a column turn-off signal and the row selection line 308 receives a row turn-off signal, the switch device 310 is turned off so that a power provided from the power supply terminal 312 is not coupled to the memory cell 302, and when at least one of the column selection line 306 and the row selection line 308 does not receive at least one of the column turn-off signal and the row turn-off signal, the power provided from the power supply terminal 312 is coupled to the memory cell 302.

It is preferred that the memory array 402 comprises a DRAM array in the memory device described above.

From the description mentioned above, the power from the power supply terminal is not coupled to the memory cell and the leakage current therefrom is reduced by, for example, simultaneously selecting the column selection line and the row selection line in response to a defective memory cell in accordance with the device and the method for breaking the leakage current path of the present invention. When the memory array is in a stand-by state, the leakage current generated from the defective memory cells and power consumption are reduced by, for example, turning off all defective memory cells.

From the description mentioned above, one embodiment of the present invention is a device and a method for breaking the leakage current path caused by process defects. However, the present invention is not limited thereto. The device and the method of the present invention can be applied to any defective memory cells within a memory array by selecting a column selection line and a row selection line in response to a specific defective memory cell for breaking the leakage current path. More preferably, the column selection line and the row selection line are controlled by a stand-by signal for specifying the timing for breaking the leakage current path.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

The invention claimed is:

1. A device for breaking a leakage current path existing in a defect memory cell in a memory array within a memory device, comprising:
    a column selection line coupled to a first circuit block and adapted to select a column of a memory cell within a memory array, wherein the first circuit block outputs a column turn-off signal when the defect memory cell is detected;
    a row selection line coupled to a second circuit block and adapted to select a row of the memory cell within the memory array, wherein the second circuit block outputs a row turn-off signal when the defect memory cell is detected;
    a sensing amplifier; and
    a switch device coupled to the memory cell, a power supply terminal, the sensing amplifier, the column selection line and the row selection line, wherein when the memory cell is the defect memory cell, both the column selection line receives the column turn-off signal and the row selection line receives the row turn-off signal, so that the switch device is turned off and a coupling between the power supply terminal and the defect memory cell is disconnected, thereby breaking the leakage current path existing in the defect memory cell.

2. The device for breaking the leakage current path of claim 1, wherein the switch device further comprises:
    a first switch coupled to the memory cell, the power supply terminal and the column selection line, wherein when the column selection line receives the column turn-off signal, the first switch is turned off so that the power is not coupled to the memory cell, and when the column selection line does not receive the column turn-off signal, the power is coupled to the memory cell; and
    a second switch coupled to the memory cell, the power supply terminal and the row selection line, wherein when the row selection line receives the row turn-off signal, the second switch is turned off so that the power is not coupled to the memory cell, and when the row selection line does not receive the row turn-off signal, the power is coupled to the memory cell.

3. The device for breaking the leakage current path of claim 2, wherein each of the first switch and the second switch comprises a PMOS transistor or PMOSFET transistor.

4. The device for breaking the leakage current path of claim 1, wherein the column turn-off signal and the row turn-off signal are controlled by a stand-by signal.

5. A method for breaking a leakage current path existing in a defect memory cell for a circuit having a memory array, the method comprising:
    selecting a column selection line in response to a memory cell within a memory array;
    selecting a row selection line in response to the memory cell within the memory array;
    coupling a switch device to the memory cell, a power supply terminal, a sensing amplifier, the column selection line and the row selection line; and
    turning off the switch device through coupling a column turn-off signal to the column selection line and a row turn-off signal to the row selection line when the memory cell is detected to be the defective memory cell so that a power provided from the power supply terminal is not coupled to the defect memory cell.

6. The method for breaking the leakage current path of claim 5, wherein the column turn-off signal and the row turn-off signal are controlled by stand-by signal.

7. A memory device, comprising:
    a column selection line coupled to a first circuit block and adapted to select a column of a memory cell within a memory array, wherein the first circuit block outputs a column turn-off signal when a defect memory cell is detected;
    a row selection line coupled to a second circuit block and adapted to select a row of the memory cell within the memory array, wherein the second circuit block outputs a row turn-off signal when the defect memory cell is detected;
    a sensing amplifier; and
    a device for breaking a leakage current path, comprising a switch device coupled to the memory cell, a power supply terminal, the sensing amplifier, the column selection line and the row selection line, wherein only when the memory cell is the defect memory cell, both the column selection line receives a column turn-off signal and the row selection line receives a row turn-off signal, so that the switch device is turned off and a coupling between the power supply terminal and the defect memory cell is disconnected, thereby breaking a leakage current path existing in the defect memory cell.

8. The memory device of claim 7, wherein the switch device further comprises:
    a first switch coupled to the memory cell, the power supply terminal and the column selection line, wherein when the column selection line receives the column turn-off signal, the first switch is turned off so that the power is not coupled to the memory cell, and when the column selection line does not receive the column turn-off signal, the power is coupled to the memory cell; and
    a second switch coupled to the memory cell, the power supply terminal and the row selection line, wherein when the row selection line receives the row turn-off signal, the second switch is turned off so that the power is not coupled to the memory cell, and when the row selection line does not receive the row turn-off signal, the power is coupled to the memory cell.

9. The memory device of claim 8, wherein each of the first switch and the second switch comprises a PMOS transistor or PMOSFET transistor.

10. The memory device of claim 7, wherein the column turn-off signal and the row turn-off signal are controlled by a stand-by signal.

11. The memory device of claim 7, wherein the memory array comprises a DRAM array.

12. The memory device of claim 7, wherein the first circuit block is disposed between an original selection signal and the column selection line for controlling the original selection signal and generating a final column selection signal from a stand-by signal and a fuse signal of the final column selection signal.

13. The memory device of claim 7, wherein the second circuit block generates a final row selection signal from a stand-by signal and a fuse signal of the final row selection signal.

14. The memory device of claim 12, wherein a state of the fuse signal of the final column selection signal and a state of the fuse signal of the final row selection signal for a selected normal memory cell are substantially lower than those of a selected defect memory cell and the column turn-off signal and the row turn-off signal are generated in response to the state of the fuse signal of the final column signal and state of the fuse signal of the row selection signal.

* * * * *